US011187988B2

(12) United States Patent
Kono

(10) Patent No.: US 11,187,988 B2
(45) Date of Patent: Nov. 30, 2021

(54) EXPOSURE APPARATUS, AND ARTICLE MANUFACTURING METHOD

(71) Applicant: CANON KABUSHIKI KAISHA, Tokyo (JP)

(72) Inventor: Michio Kono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/899,437

(22) Filed: Jun. 11, 2020

(65) Prior Publication Data

US 2020/0301287 A1 Sep. 24, 2020

Related U.S. Application Data

(63) Continuation of application No. PCT/JP2018/045144, filed on Dec. 7, 2018.

(30) Foreign Application Priority Data

Dec. 15, 2017 (JP) .............................. JP2017-241079

(51) Int. Cl.
*G03F 7/20* (2006.01)
*G02B 26/08* (2006.01)
*G02B 27/10* (2006.01)

(52) U.S. Cl.
CPC ..... *G03F 7/70191* (2013.01); *G02B 26/0833* (2013.01); *G02B 27/1006* (2013.01); *G03F 7/702* (2013.01); *G03F 7/70075* (2013.01); *G03F 7/70358* (2013.01)

(58) Field of Classification Search
CPC ............ G02B 26/0833; G02B 27/1006; G02B 27/283; G03F 7/20; G03F 7/70075; G03F 7/70191; G03F 7/72; G03F 7/70208; G03F 7/70275; G03F 7/70358; G03F 7/70291
See application file for complete search history.

(56) References Cited

U.S. PATENT DOCUMENTS

2007/0296936 A1* 12/2007 Kato ................... G03F 7/70791
355/52
2014/0320835 A1* 10/2014 Fujiwara .............. G01M 11/005
355/67

FOREIGN PATENT DOCUMENTS

| JP | 2000-021748 A | 1/2000 |
| JP | 2004-062155 A | 2/2004 |
| JP | 2010-204508 A | 9/2010 |
| JP | 2012-145613 A | 8/2012 |
| JP | 2014-514759 A | 6/2014 |

OTHER PUBLICATIONS

Ando et al. Machine translation of JP 2010-204508, Sep. 2010.*
International Preliminary Report on Patentability of PCT/JP2018/045144 dated Jun. 16, 2020.

* cited by examiner

*Primary Examiner* — Peter B Kim
(74) *Attorney, Agent, or Firm* — Canon U.S.A., Inc. I.P. Division

(57) ABSTRACT

An exposure apparatus according to the present invention includes an illumination optical system including a first optical modulation unit having a plurality of optical modulation elements, a second optical modulation unit having a plurality of optical modulation elements, and an imaging optical system forming optical images on a predetermined plane by using lights from the first optical modulation unit and the second optical modulation unit, and a projection optical system projecting the optical image formed on the predetermined plane onto a substrate.

19 Claims, 12 Drawing Sheets

MU1

MU2

MU3

MU4

US 11,187,988 B2

EXPOSURE APPARATUS, AND ARTICLE MANUFACTURING METHOD

CROSS-REFERENCE TO RELATED APPLICATIONS

This application is a Continuation of International Patent Application No. PCT/JP2018/045144, filed Dec. 7, 2018, which claims the benefit of Japanese Patent Application No. 2017-241079, filed Dec. 15, 2017, both of which are hereby incorporated by reference herein in their entirety.

BACKGROUND OF THE INVENTION

Field of the Invention

The present invention relates to an exposure apparatus, and an article manufacturing method using them.

Description of the Related Art

There is known an exposure apparatus for transferring a pattern of an original (mask) to a photosensitive substrate through a projection optical system. Recently, with an increasing size of the substrate subjected to exposure by the exposure apparatus, the mask in which the pattern is formed has also been increasing. The larger size of the mask increases the cost of the mask itself, prolongs the manufacturing time of the mask, and increases the manufacturing cost of the mask.

Under that situation, an attention is focused on the so-called maskless exposure apparatus capable of forming a pattern on a substrate without using a mask in which the pattern is formed. The maskless exposure apparatus is a digital exposure apparatus using an optical modulator such as a Digital Micromirror Device (DMD). According to the maskless exposure apparatus, the pattern can be formed on the substrate without using the mask by generating exposure light corresponding to an exposure pattern with the DMD, and by performing an exposure in accordance with pattern data, which corresponds to the exposure pattern, on the substrate.

Japanese Patent Application Laid-Open No. 2004-62155 discloses a maskless exposure apparatus in which a pattern is formed on a substrate by making a laser beam emitted from a laser emission unit incident on individual optical modulation elements of an optical modulation unit, and by modulating the incident laser beam into either an exposure state or a non-exposure state with each optical modulation element.

In the maskless exposure apparatus disclosed in Japanese Patent Application Laid-Open No. 2004-62155, a plurality of projection optical systems each including one DMD are arrayed and a substrate is exposed with an optical image formed by each DMD as a spot image. As the size of the substrate subjected to exposure by the maskless exposure apparatus increases, the number of the projection optical systems to be arrayed also increases.

An increase in the number of the projection optical systems to be arrayed further increases the number of overlapped exposure regions in which the exposure is performed in an overlapped state by the projection optical systems arranged adjacent to each other. In the overlapped exposure region, the resolution performance of exposure light tends to be reduced under influences of arrangement errors in the projection optical systems and so on. It is hence preferred to reduce the number of the overlapped exposure regions as far as possible from the viewpoint of increasing the accuracy of a pattern formed on the substrate.

An object of the present invention is to provide an exposure apparatus which can realize an improvement in the resolution performance of exposure light.

SUMMARY OF THE INVENTION

The present invention provides an exposure apparatus including an illumination optical system including a first optical modulation unit having a plurality of optical modulation elements, a second optical modulation unit having a plurality of optical modulation elements, and an imaging optical system forming optical images on a predetermined plane by using lights from the first optical modulation unit and the second optical modulation unit, and a projection optical system projecting the optical image formed on the predetermined plane onto a substrate.

Further features of the present invention will become apparent from the following description of exemplary embodiments with reference to the attached drawings.

DESCRIPTION OF THE EMBODIMENTS

Embodiments of the present invention will be described in detail below with reference to the drawings. It is to be noted that the present invention is not limited to the following embodiments and the following embodiments are merely practical examples in carrying out the present invention.

First Embodiment

Figure 1:
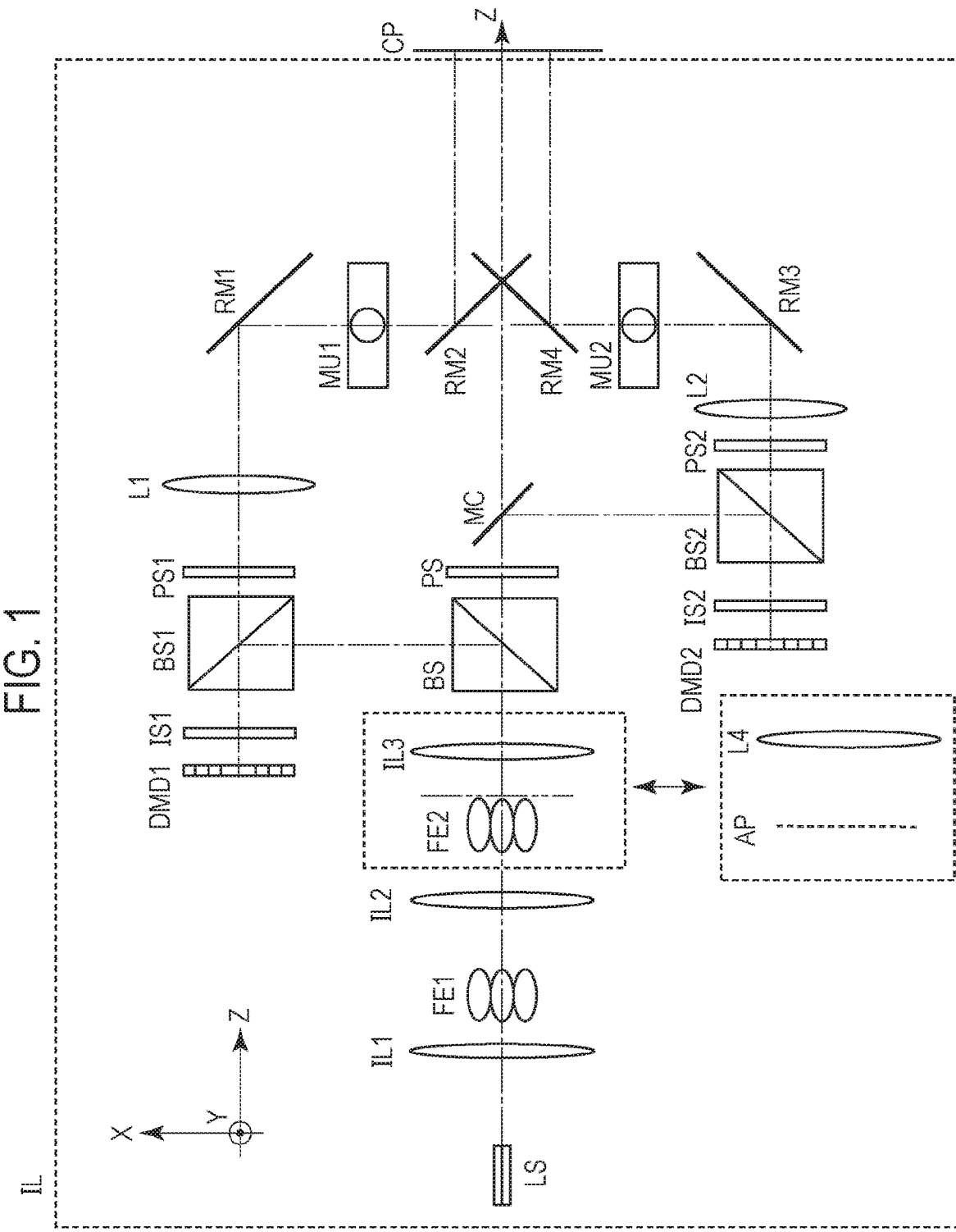
FIG. 1 illustrates a configuration of an illumination optical system according to a first embodiment.

A configuration of an illumination optical system IL according to a first embodiment will be described below with reference to FIG. 1. The optical system according to this embodiment can be applied to the so-called maskless exposure apparatus in which a pattern can be formed on a substrate without using a mask in which the pattern is formed. In this embodiment, an optical image formed by a light flux exited from the illumination optical system IL is imaged on a predetermined plane CP.

The illumination optical system IL includes a plurality of Digital Micromirror Devices (hereinafter referred to as DMDs) each of which is one type of optical modulator and serves as an optical modulation unit. In this embodiment, a first DMD (DMD1) serving as a first optical modulation unit and a second DMD (DMD2) serving as a second optical modulation unit are provided as components of the illumination optical system.

The DMD is constituted by arraying a plurality of micromirrors in a two-dimensional pattern, and angles of reflective surfaces of the individual micromirrors can be changed separately. Therefore, light incident on each mirror can be modulated into either an exposure state or a non-exposure state.

Exposure light exited from the predetermined plane CP and corresponding to an exposure pattern is condensed onto a substrate through a projection optical system (not illustrated), and pattern data corresponding to the exposure pattern is transferred to the substrate by exposure. A configuration of the projection optical system will be described later with reference to FIG. 5. Scanning exposure is performed by moving the substrate during the exposure.

A semiconductor laser or an LED (Light Emitting Diode) is used as a light source LS. The wavelength of the light source is determined in accordance with the type of a photosensitive resist that is applied on the substrate. The wavelength of the light source LS is generally from about 300 nm to about 440 nm.

The configuration of the illumination optical system IL will be described below. A light flux emitted from the light source LS is collimated by an optical system IL1 and illuminates a fly-eye lens FE1. The light flux diverged by the fly-eye lens FE1 is collimated by an optical system IL2 and illuminates a fly-eye lens FE2. The fly-eye lens FE1, the optical system IL2, and the fly-eye lens FE2 are arranged such that an exit surface of the fly-eye lens FE is positioned in a front-side focal plane of the optical system IL2 and an incident surface of the fly-eye lens FE2 is positioned in a rear-side focal plane of the optical system IL2.

The light flux diverged by the fly-eye lens FE2 is converged by an optical system IL3 and enters a first polarizing beam splitter BS that serves as polarized-light separation means. The first polarizing beam splitter BS has the function of reflecting an S-polarized component and allowing a P-polarized component to pass therethrough. S-polarized light reflected by the first polarizing beam splitter BS is incident on a second polarizing beam splitter BS1 that has polarization characteristics equivalent to those of the first polarizing beam splitter BS, and is reflected by the second polarizing beam splitter BS1.

The S-polarized light reflected by the second polarizing beam splitter BS1 is converted to circular polarized light by a λ/4 phase plate IS1 and then illuminates the first DMD (DMD1). The first DMD is arranged at a rear-side focal plane of the optical system IL3 and is Koehler-illuminated by the functions of the fly-eye lens FE2 and the optical system IL3. The light flux reflected by the first DMD passes through the λ/4 phase plate IS1 again and is converted to P-polarized light. The converted P-polarized light passes through the second polarizing beam splitter BS1 and then is incident on a phase plate PS1.

The phase plate PS1 is an ND filter or a phase plate such as a λ/4 phase plate. The ND filter is used to make the light amount of an optical image formed on the predetermined plane CP with the light flux from the first DMD be equal of the light amount of an optical image formed on the predetermined plane CP with a light flux from the second DMD described later. The λ/4 phase plate is used to convert the P-polarized light, which has passed through the second polarizing beam splitter BS1, to circular polarized light. By illuminating the substrate with the circular polarized light, the accuracy in formation of the pattern can be prevented from degrading, for example, when a resist applied on the substrate has polarization characteristics. Thus, when the resist has the polarization characteristics, it is effective to illuminate the resist with the circular polarized light. The phase plate PS1 is not an essential component and may not need to be arranged when adjustment of the light amount is not required, or when change in polarization characteristics of the exposure light is not required.

The light flux having passed through the phase plate PS1 is incident on an optical system L1. The optical system L1 functions as an imaging optical system by which the light flux reflected by the first DMD as an object plane is imaged on the predetermined plane CP. The light flux having passed through the optical system L1 is reflected by a first reflecting mirror RM1 and a second reflecting mirror RM2, and then reaches the predetermined plane CP.

An optical-axis decentering unit MU1 for decentering an optical axis is arranged between the first reflecting mirror RM1 and the second reflecting mirror RM2. The optical image to be formed on the predetermined plane CP is shifted in an XY section by the optical-axis decentering unit MU1. A configuration of the optical-axis decentering unit MU1 will be described later.

On the other hand, the P-polarized light having passed through the first polarizing beam splitter BS is converted to S-polarized light by a λ/2 phase plate PS and is reflected by a reflecting mirror MC. Thereafter, the reflected S-polarized light is incident on a third polarizing beam splitter BS2 that has polarization characteristics equivalent to those of the first polarizing beam splitter BS. The S-polarized light having been incident on the third polarizing beam splitter BS2 is reflected by the third polarizing beam splitter BS2.

The S-polarized light reflected by the third polarizing beam splitter BS2 is converted to circular polarized light by a λ/4 phase plate IS2 and then illuminates the second DMD (DMD2). The second DMD is arranged at the rear-side focal plane of the optical system IL3 and is Koehler-illuminated by the functions of the fly-eye lens FE2 and the optical system IL3. The light flux reflected by the second DMD passes through the λ/4 phase plate IS2 again and is converted to P-polarized light. The converted P-polarized light passes through the third polarizing beam splitter BS2 and then is incident on a phase plate PS2. The phase plate PS2 is an optical member that has equivalent characteristics to those of the above-described phase plate PS1.

The light flux having passed through the phase plate PS2 is incident on an optical system L2. The optical system L2 functions as an imaging optical system by which the light flux reflected by the second DMD as an object plane is imaged on the predetermined plane CP. The light flux having passed through the optical system L2 is reflected by a third reflecting mirror RM3 and a fourth reflecting mirror RM4, and then reaches the predetermined plane CP.

An optical-axis decentering unit MU2 for decentering an optical axis is arranged between the third reflecting mirror RM3 and the fourth reflecting mirror RM4. The optical image to be formed on the predetermined plane CP is shifted in an XY section by the optical-axis decentering unit MU2. A configuration of the optical-axis decentering unit MU2 will be described below.

Figure 2:
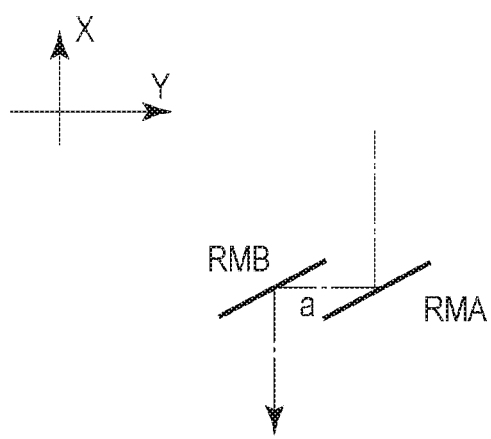
FIG. 2 illustrates a configuration of an optical-axis decentering unit according to the first embodiment.
Figure 2:
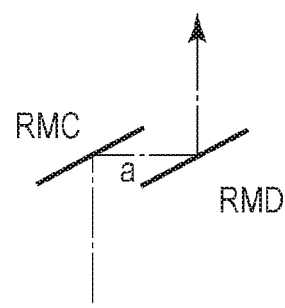

The configurations of the optical-axis decentering units MU1 and MU2 are now described with reference to FIG. 2. The optical-axis decentering unit MU1 is consists of a reflecting mirror RMA and a reflecting mirror RMB. The reflecting mirror RMA and the reflecting mirror RMB are arranged side by side in a Y-axis direction that is a substrate scanning direction. The light flux incident on the optical-axis decentering unit MU1 is reflected by each of the reflecting mirror RMA and the reflecting mirror RMB. As a result, an optical axis of the light flux passing through the optical-axis decentering unit MU1 is shifted by a distance a in a Y-axis negative direction.

The optical-axis decentering unit MU2 is consists of a reflecting mirror RMC and a reflecting mirror RMD. The reflecting mirror RMC and the reflecting mirror RMD are arranged side by side in the Y-axis direction. The light flux incident on the optical-axis decentering unit MU2 is reflected by each of the reflecting mirror RMC and the reflecting mirror RMD. As a result, an optical axis of the light flux passing through the optical-axis decentering unit MU2 is shifted by a distance a in a Y-axis positive direction.

Figure 3:
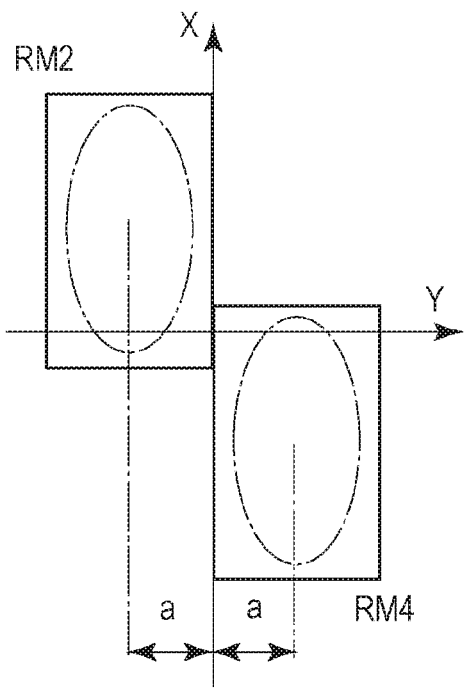
FIG. 3 illustrates an arrangement of reflecting mirrors in an XY plane.

Furthermore, as illustrated in FIG. 3, the second reflecting mirror RM2 and the fourth reflecting mirror RM4 are each arranged to be shifted by the distance a in the Y-axis direction from the optical axis of the illumination optical system IL. In this embodiment, the second reflecting mirror RM2 is arranged to be shifted by the distance a in the Y-axis negative direction, and the fourth reflecting mirror RM4 is arranged to be shifted by the distance a in the Y-axis positive direction. In addition, the second reflecting mirror RM2 and the fourth reflecting mirror RM4 are arranged to be shifted in opposite directions in an X-axis direction. With such an arrangement, the scanning exposure can be performed over a wide range on the substrate.

The arrangement of the optical images formed on the predetermined plane CP will be described below with reference to FIGS. 4A and 4B. As mentioned above, the second reflecting mirror RM2 and the fourth reflecting mirror RM4 are arranged to be shifted in opposite directions in each of the X-axis direction and the Y-axis direction. Accordingly, as illustrated in FIG. 4A, the optical image formed with the light flux from the first DMD and the optical image formed with the light flux from the second DMD are positioned in a state shifted away from each other in each of the X-axis direction and the Y-axis direction.

Figure 4A:
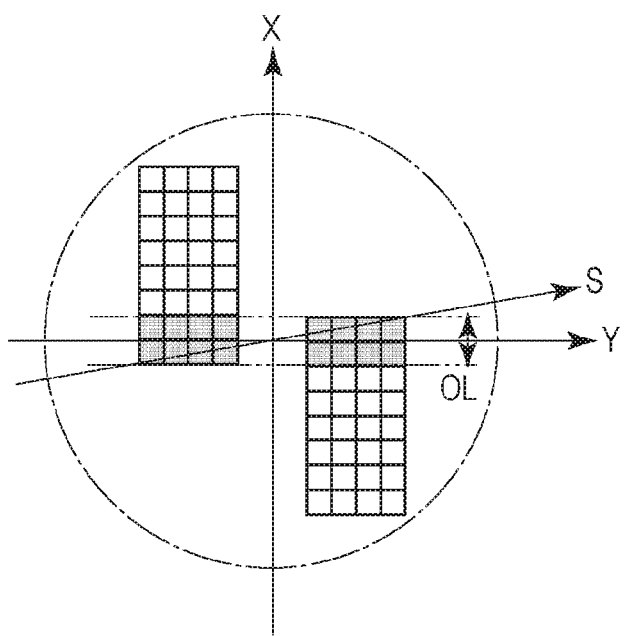
FIG. 4A illustrates optical images formed by light fluxes from DMDs.

A circle denoted by a broken line in FIG. 4A indicates a field of view of the projection optical system. As seen from FIG. 4A, the optical image formed with the light flux from the first DMD and the optical image formed with the light flux from the second DMD are located within the field of view of the projection optical system without overlapping each other.

An arrow S in FIG. 4A denotes the substrate scanning direction. The substrate can be uniformly exposed by inclining the substrate scanning direction from an array direction of micromirrors forming each DMD. A range in the X-axis direction, denoted by OL, represents an overlapped exposure region that is doubly exposed during the scanning exposure with both the light flux from the first DMD and the light flux from the second DMD. An exposure amount in the overlapped exposure region can be appropriately adjusted by controlling the modulated states of micromirrors forming each of the first DMD and the second DMD corresponding to the overlapped exposure region.

Figure 4B:
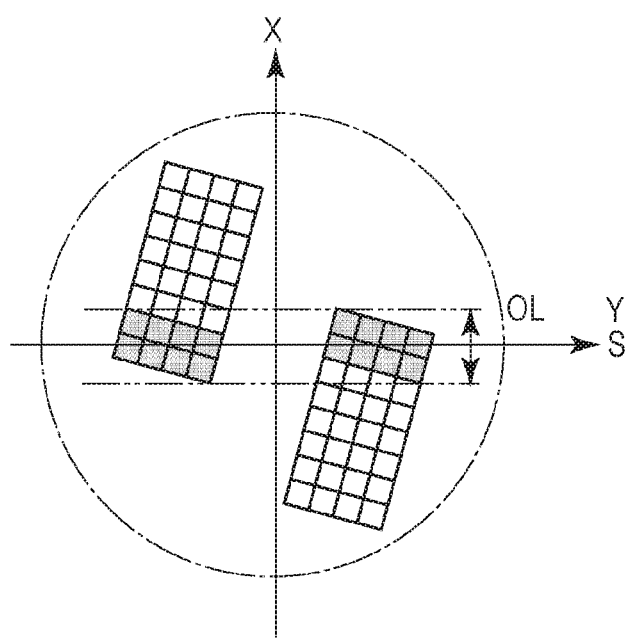
FIG. 4B illustrates optical images formed by the light fluxes from DMDs.

FIG. 4B illustrates the arrangement of the optical images formed on the predetermined plane CP when the optical images formed on the predetermined plane CP are inclined instead of inclining the substrate scanning direction from the array direction of the micromirrors forming the DMD. The optical images formed on the predetermined plane CP can be inclined by inclining the first DMD and the second DMD. With such an arrangement, the substrate can also be uniformly exposed.

Figure 5:
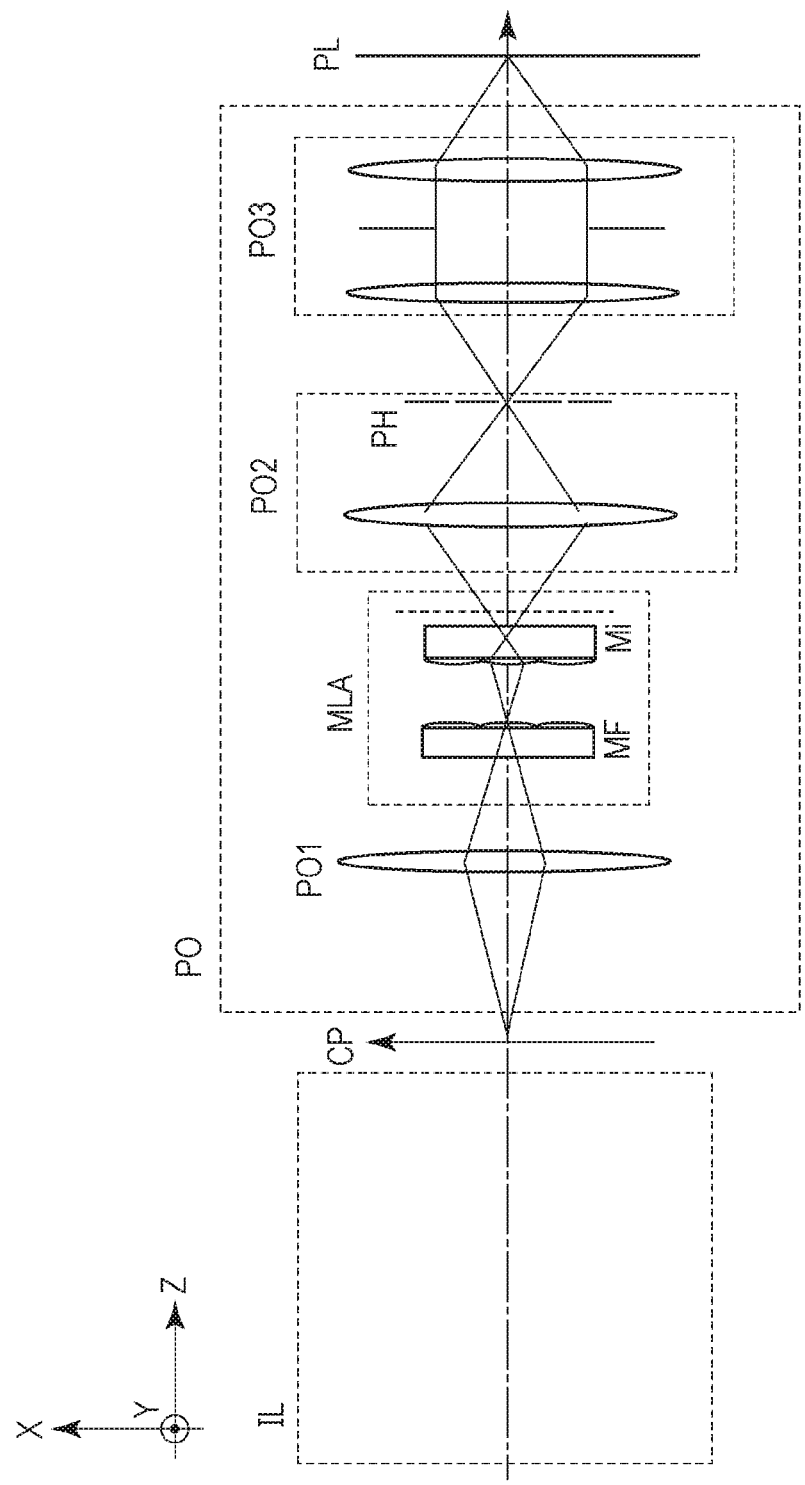
FIG. 5 illustrates a configuration of an exposure apparatus including a projection optical system according to the present invention.

The configuration of the projection optical system PO will be described below with reference to FIG. 5. The light flux from the predetermined plane CP is incident on an optical system PO1 forming the projection optical system PO. The optical system PO1 has the function of condensing the light flux having been incident on the optical system PO1 to a microlens array MLA. The microlens array MLA consists of a field lens MF and an imaging lens Mi arranged at a position away from the field lens MF by a distance corresponding to the focal length of the field lens MF.

The light flux imaged on the field lens MF by the optical system PO1 is re-imaged by the imaging lens Mi. In this embodiment, a point at which the light flux is re-imaged by the imaging lens Mi is positioned inside the imaging lens Mi. The light flux from the re-imaging point is further imaged again by an optical system PO2, and a pinhole member PH is arranged at a position at which the light flux is imaged by the optical system PO2.

Each opening of the pinhole member PH correspond to positions of respective spot images formed on the predetermined plane CP. Spot lights having diameters reduced by the pinhole member PH are incident on a substrate PL through an optical system PO3. When the diameters of the spot lights formed by the optical system PO2 are sufficiently small, the pinhole member PH and the optical system PO3 are not needed.

Second Embodiment

Figure 6:
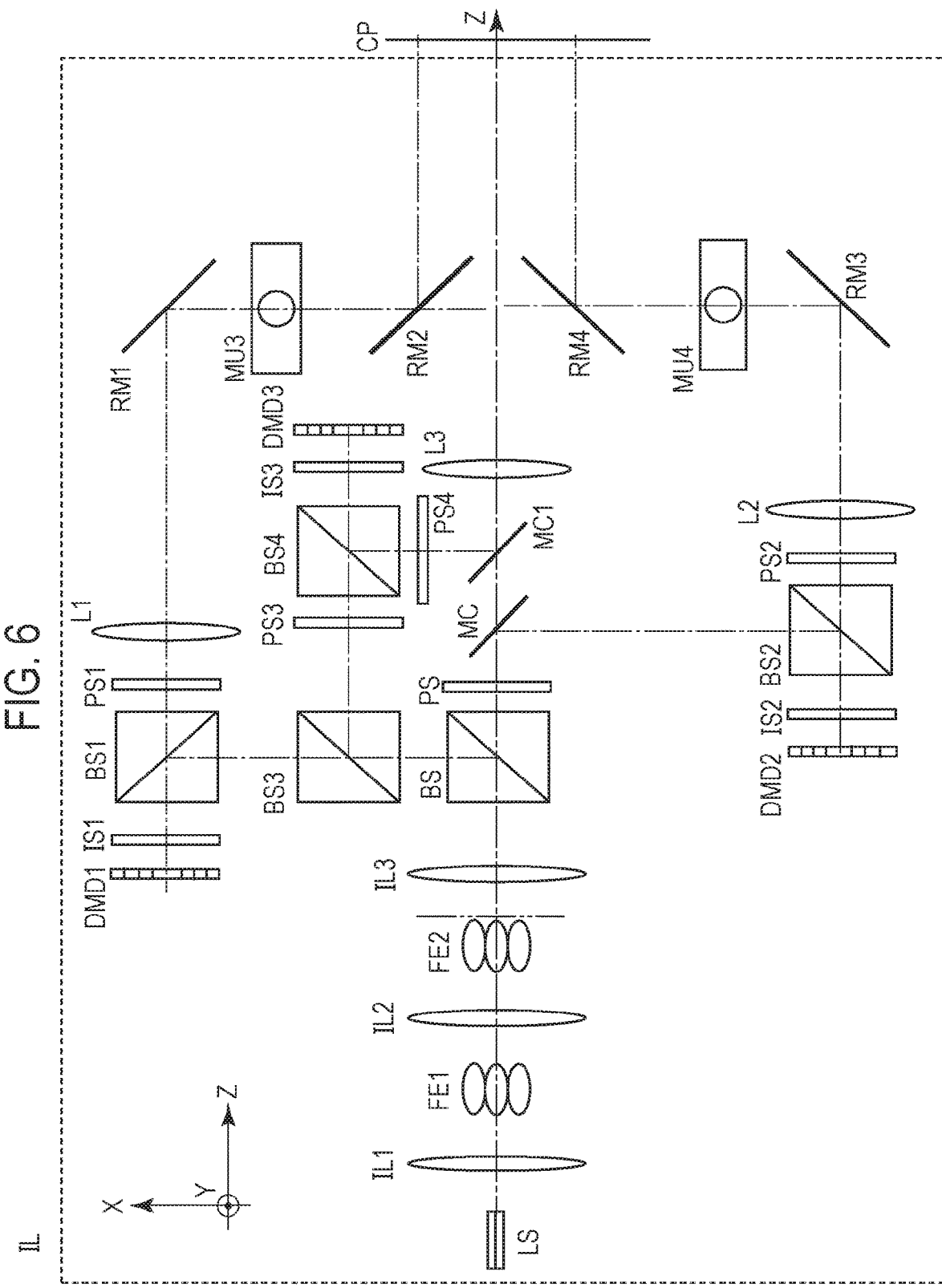
FIG. 6 illustrates a configuration of an illumination optical system according to a second embodiment.

A configuration of an illumination optical system IL according to a second embodiment will be described below with reference to FIG. 6. In this embodiment, a third DMD (DMD3) serving as a third optical modulation unit is provided as a component of the illumination optical system in addition to the first DMD (DMD1) and the second DMD (DMD2). Description of the same components as those in the illumination optical system IL according to the first embodiment is omitted, and different points from the first embodiment will be described in detail.

In the illumination optical system IL according to this embodiment, the S-polarized light reflected by the first polarizing beam splitter BS is incident on a fourth polarizing beam splitter BS3. The fourth polarizing beam splitter BS3 has such polarization characteristics that a ratio of reflected light to transmitted light is about 1:1 with respect to the incident S-polarized light. The S-polarized light having passed through the fourth polarizing beam splitter BS3 reaches the predetermined plane CP through the same optical path as that described above with reference to FIG. 1.

On the other hand, the S-polarized light reflected by the fourth polarizing beam splitter BS3 is converted to P-polarized light by a λ/2 phase plate PS3 and then is incident on a fifth polarizing beam splitter BS4. The fifth polarizing beam splitter BS4 has the function of reflecting an S-polarized component and allowing a P-polarized component to pass therethrough. The P-polarized light having been incident on the fifth polarizing beam splitter BS4 passes through the fifth polarizing beam splitter BS4, and is converted to circular polarized light by a λ/4 phase plate IS3. Then, the converted circular polarized light illuminates the third DMD.

The third DMD is arranged at the rear-side focal plane of the optical system IL3 and is Koehler-illuminated by the functions of the fly-eye lens FE2 and the optical system IL3. The light flux reflected by the third DMD passes through the λ/4 phase plate IS3 again and is converted to S-polarized light. The converted S-polarized light is reflected by the fifth polarizing beam splitter BS4 and then is incident on a phase plate PS4. The phase plate PS4 has the same function as the phase filter PS1, and it is an ND filter or a phase plate such as a λ/4 phase plate.

The light flux having passed through the phase plate PS4 is reflected by the reflecting mirror MC1 and then is incident on an optical system L3. The optical system L3 has the function of imaging the light flux reflected by the third DMD as an object plane on the predetermined plane CP. An optical path through which the P-polarized light having passed through the first polarizing beam splitter BS reaches the predetermined plane CP is the same as that illustrated in FIG. 1, and hence description of that optical path is omitted.

Figure 7:
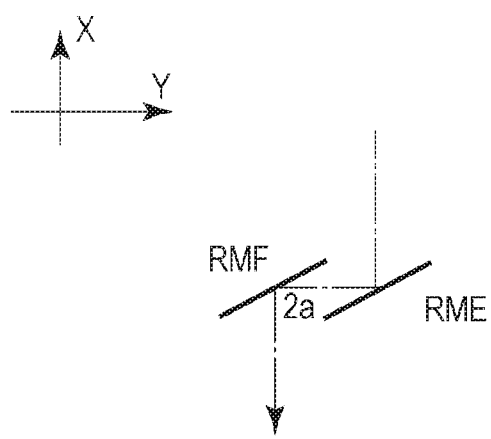
FIG. 7 illustrates a configuration of an optical-axis decentering unit according to the second embodiment.
Figure 7:
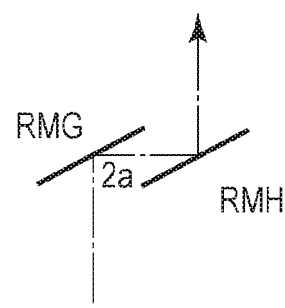

Configurations of optical-axis decentering units MU3 and MU4 will be described below with reference to FIG. 7. The optical-axis decentering unit MU3 consists of a reflecting mirror RME and a reflecting mirror RMF. The reflecting mirror RME and the reflecting mirror RMF are arranged side by side in the Y-axis direction. A light flux incident on the optical-axis decentering unit MU3 is reflected by each of the reflecting mirror RME and the reflecting mirror RMF. As a result, an optical axis of the light flux passing through the optical-axis decentering unit MU3 is shifted by a distance 2a in the Y-axis negative direction.

The optical-axis decentering unit MU4 consists of a reflecting mirror RMG and a reflecting mirror RMH. The reflecting mirror RMG and the reflecting mirror RMH are arranged side by side in the Y-axis direction. A light flux incident on the optical-axis decentering unit MU4 is reflected by each of the reflecting mirror RMG and the reflecting mirror RMH. As a result, an optical axis of the light flux passing through the optical-axis decentering unit MU4 is shifted by a distance 2a in the Y-axis positive direction.

Figure 8:
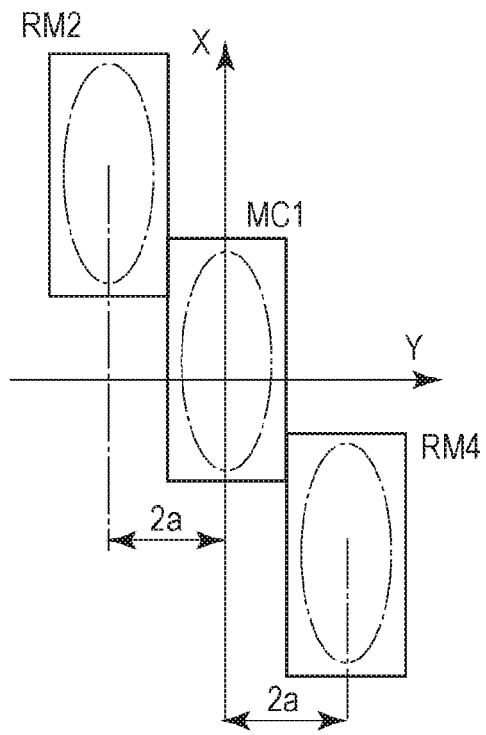
FIG. 8 illustrates an arrangement of reflecting mirrors in an XY plane.

As illustrated in FIG. 8, the second reflecting mirror RM2 and the fourth reflecting mirror RM4 are each arranged to be shifted by the distance 2a in the Y-axis direction from the optical axis of the illumination optical system IL. In this embodiment, the second reflecting mirror RM2 is arranged to be shifted by the distance 2a in the Y-axis negative direction, and the fourth reflecting mirror RM4 is arranged to be shifted by the distance 2a in the Y-axis positive direction. In addition, the reflecting mirror MC1 is arranged between the second reflecting mirror RM2 and the fourth reflecting mirror RM4.

Moreover, the second reflecting mirror RM2 and the fourth reflecting mirror RM4 are arranged to be shifted in opposite directions in the X-axis direction. Hence the scanning exposure can be performed over a wider range than in the first embodiment.

Figure 9A:
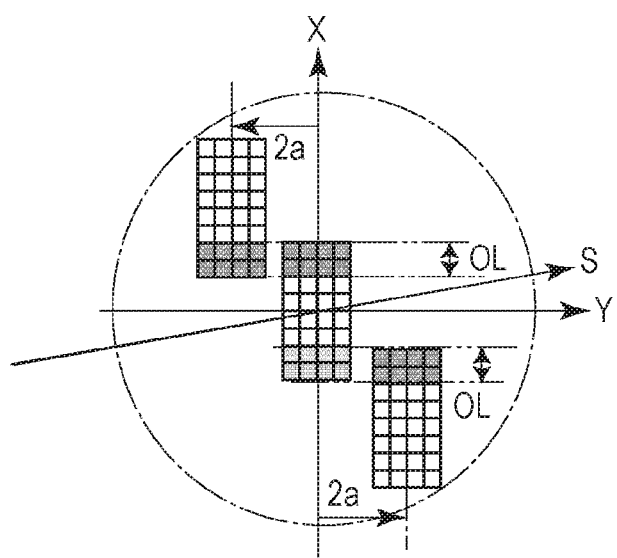
FIG. 9A illustrates optical images formed by light fluxes from DMDs.

The arrangement of optical images formed on the predetermined plane CP will be described below with reference to FIGS. 9A and 9B. As mentioned above, the second reflecting mirror RM2 and the fourth reflecting mirror RM4 are arranged to be shifted in opposite directions in each of the X-axis direction and the Y-axis direction. Accordingly, as illustrated in FIG. 9A, the optical image formed with the light flux from the first DMD and the optical image formed with the light flux from the second DMD are positioned in a state shifted away from each other in each of the X-axis direction and the Y-axis direction. In addition, the optical image formed with the light flux from the reflecting mirror MC1 is positioned between the optical image formed with the light flux from the first DMD and the optical image formed with the light flux from the second DMD.

A circle denoted by a broken line in FIG. 9A indicates the field of view of the projection optical system. As seen from FIG. 9A, the optical image formed with the light flux from the first DMD, the optical image formed with the light flux from the second DMD, and the optical image formed with the light flux from the reflecting mirror MC1 are located inside the field of view of the projection optical system without overlapping each other.

An arrow S in FIG. 9A denotes the substrate scanning direction. The substrate can be uniformly exposed by inclining the substrate scanning direction from an array direction of micromirrors forming each DMD. A range in the X-axis direction, denoted by OL, represents an overlapped exposure region that is doubly exposed during the scanning exposure with both the light flux from the first DMD and the light flux from the reflecting mirror MC1, and an overlapped exposure region that is doubly exposed during the scanning exposure with both the light flux from the second DMD and the light flux from the reflecting mirror MC1. Exposure amounts in the overlapped exposure regions can be appropriately adjusted by controlling the modulated states of the micromirrors forming each of the first DMD, the second DMD, and the third DMD corresponding to the overlapped exposure region.

Figure 9B:
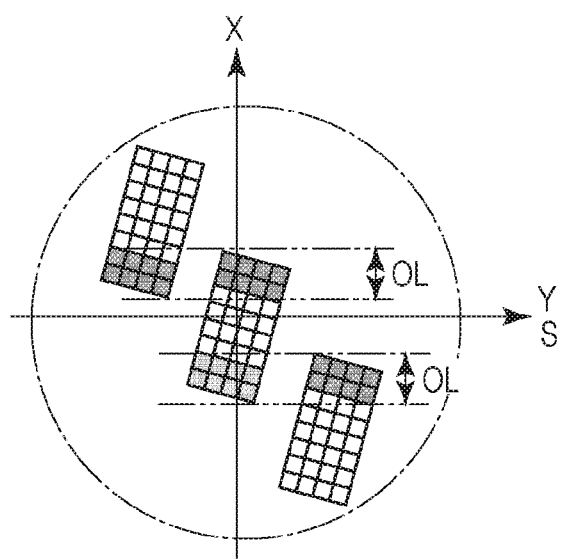
FIG. 9B illustrates optical images formed by the light fluxes from DMDs.

FIG. 9B illustrates the arrangement of the optical images formed on the predetermined plane CP when the optical images formed on the predetermined plane CP are inclined instead of inclining the substrate scanning direction from the array direction of the micromirrors forming the DMD. The optical images formed on the predetermined plane CP can be inclined by inclining the first DMD, the second DMD, and the third DMD. As a result, the substrate can be uniformly exposed.

Third Embodiment

Figure 10:
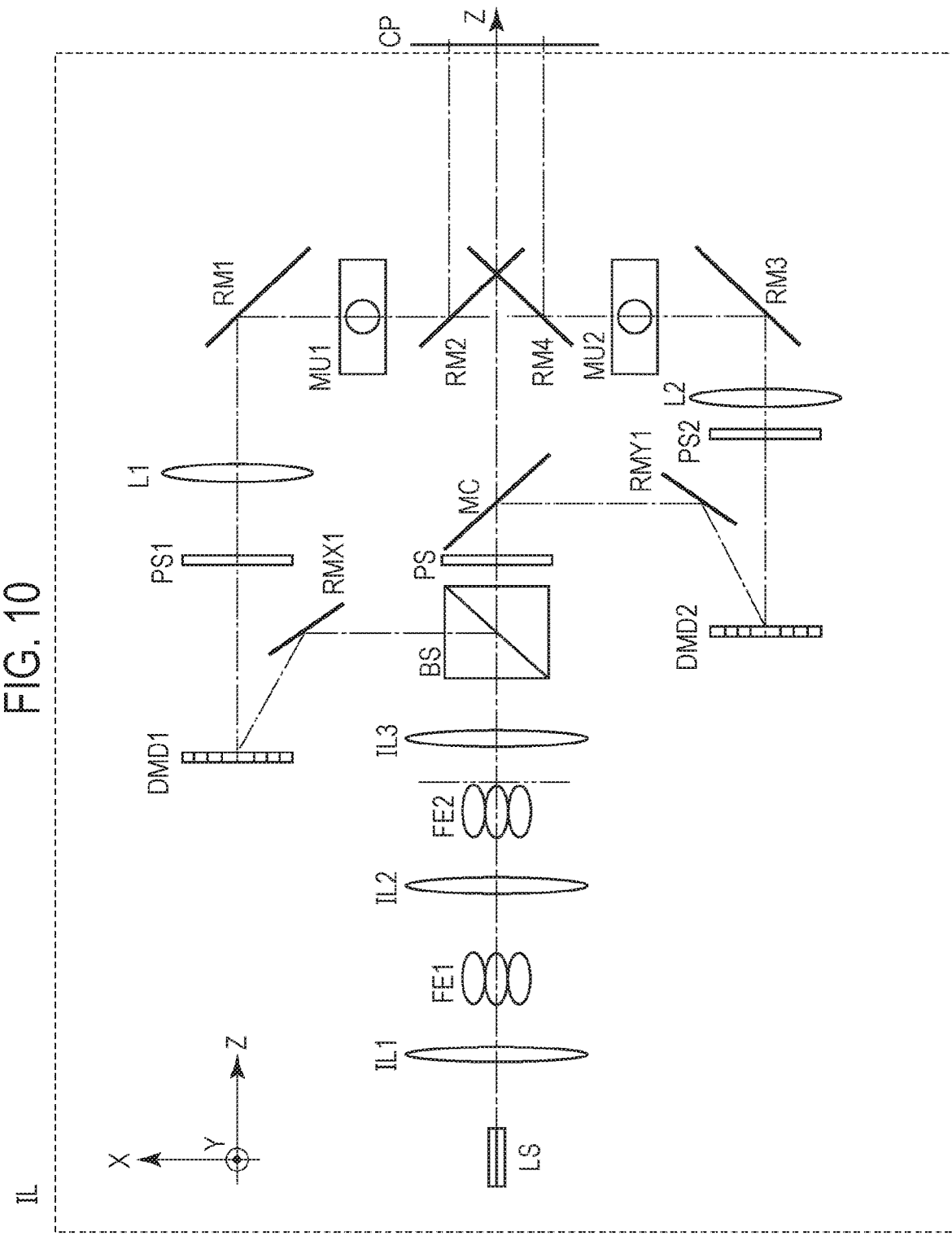
FIG. 10 illustrates a configuration of an illumination optical system according to a third embodiment.

A configuration of an illumination optical system IL according to a third embodiment will be described below with reference to FIG. 10. In this embodiment, a reflecting mirror RMX1 is arranged between the first polarizing beam splitter BS and the first DMD, and a reflecting mirror RMY1 is arranged between the first polarizing beam splitter BS and the second DMD. The reflecting mirror RMX1 reflects the light flux so as to be obliquely incident on the first DMD, and the reflecting mirror RMY1 reflects the light flux so as to be obliquely incident on the second DMD. The other configuration is similar to that in the first embodiment, and hence description of the other configuration is omitted.

For example, when a maximum inclination angle of the micromirrors forming the DMD is large, the light flux incident on the DMD and the light flux reflected by the DMD can be made not overlapped with each other even if the light flux is obliquely incident on the DMD. Thus, when the oblique incidence of the light flux on the DMD is allowed, the optical system between the first polarizing flux splitter BS and the DMD can be simplified as in this embodiment.

Fourth Embodiment

Figure 11:
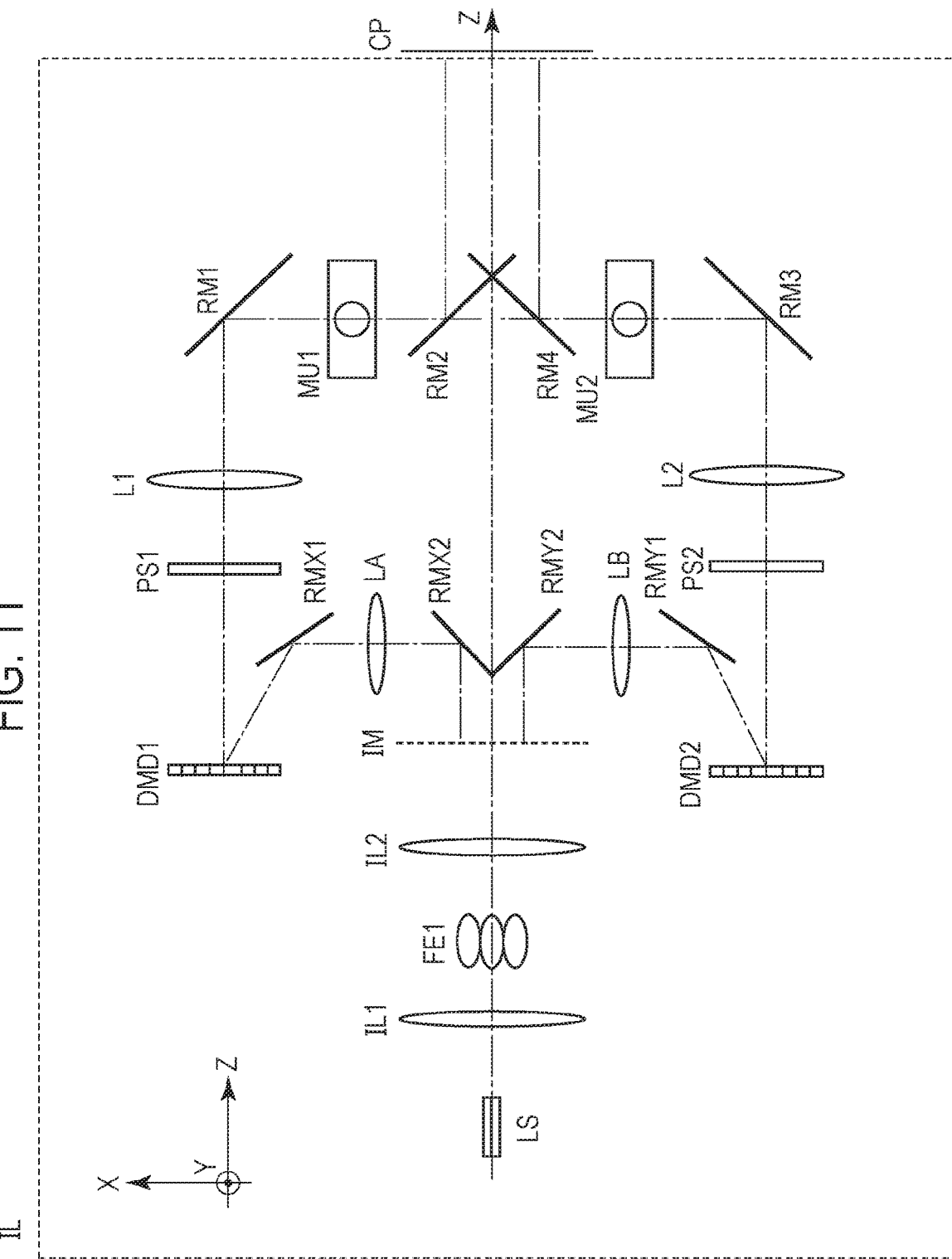
FIG. 11 illustrates a configuration of an illumination optical system according to a fourth embodiment.

A configuration of an illumination optical system IL according to a fourth embodiment will be described below with reference to FIG. 11. In this embodiment, a reflecting mirror RMX2 and a reflecting mirror RMY2 are arranged at the predetermined plane CP side of the rear-side focal plane IM of the optical system IL2. The rear-side focal plane IM of the optical system IL2 is Koehler-illuminated by the functions of the fly-eye lens FE1 and the optical system IL2, and the rear-side focal plane IM has a uniform illuminance distribution.

The light flux reflected by the reflecting mirror RMX2 illuminates the first DMD after passing through an optical system LA and reflected by the reflecting mirror RMX1. The light flux reflected by the reflecting mirror RMY2 illuminates the second DMD after passing through an optical system LB and reflected by the reflecting mirror RMY1. The other configuration is similar to that in the first embodiment, and hence description of the other configuration is omitted.

The reflecting mirror RMX2 and the reflecting mirror RMY2 have the function of separating the uniform illuminance distribution formed in the rear-side focal plane IM into different fields of view, and optical images dividing the illuminance distribution formed in the rear-side focal plane IM are formed on the first DMD and the second DMD. In other words, by adopting the configuration of this embodiment, the first DMD and the second DMD can be each illuminated with the light flux having the uniform illuminance distribution, and illuminance unevenness in the illumination optical system IL can be reduced.

Fifth Embodiment

Figure 12:
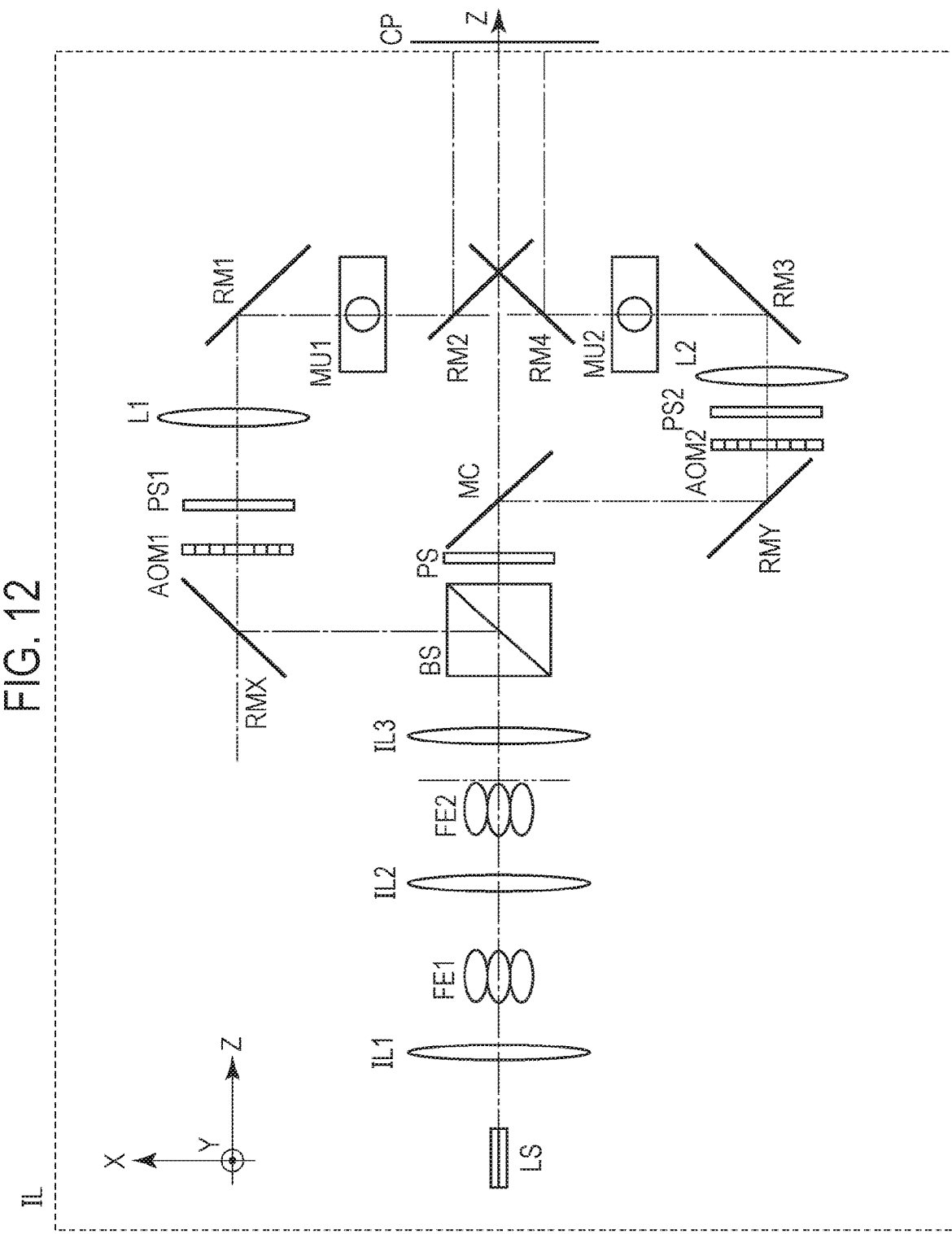
FIG. 12 illustrates a configuration of an illumination optical system according to a fifth embodiment.

A configuration of an illumination optical system IL according to a fifth embodiment will be described below with reference to FIG. 12. In this embodiment, an acoustic-optical beam modulator AOM of light transmissive type is used as the optical modulator instead of the DMD. This embodiment is different from the first embodiment in that a reflecting mirror RMX is arranged instead of the second polarizing beam splitter BS1, and a reflecting mirror RMY is arranged instead of the third polarizing beam splitter BS2. The other configuration is similar to that in the first embodiment, and hence description of the other configuration is omitted.

In this embodiment, the illuminance of a light flux incident on the acoustic-optical beam modulator AOM is changed by applying a modulation signal to the acoustic-optical beam modulator AOM. The illuminance can be changed by turning on or off the modulation signal by a digital signal source (not illustrated) to switch an output direction of a light pulse.

MODIFICATIONS

Lens cells forming the fly-eye lens may be either spherical lenses or cylindrical lenses. When the number of the array of the micromirrors forming the DMD is different between the X axis and the Y axis, the lengths of the entire DMD in the X-axis direction and the Y-axis direction are different from each other. In such a case, by using, as the lens cells forming the fly-eye lens FE, cylindrical lenses each having different focal lengths between the X-axis direction and the Y-axis direction, the shape of the spot light can be made different between the X-axis direction and the Y-axis direction, and illumination efficiency can be increased.

Furthermore, in the embodiment using the fly-eye lens FE2, a stop having a plurality of apertures may be arranged instead of the fly-eye lens FE2. In this case, light fluxes having passed through the respective apertures of the diaphragm are imaged on the micromirrors forming the DMD.

While in the above embodiments a light intensity distribution of the light flux emitted from the light source is made uniform by using the fly-eye lens, another means for making the light intensity distribution be uniform, such as a rod integrator, may be used instead of the fly-eye lens.

Further, while in the above embodiments the light flux emitted from one light source is divided to illuminate the plurality of optical modulation units, the light source may be provided for each of the optical modulation units. In such a case, optical-path division means such as the polarizing beam splitter is no longer required, and the configuration of the illumination optical system IL can be simplified.

(Article Manufacturing Method)

An article manufacturing method according to an embodiment of the present invention is suitable for manufacturing articles, for example, micro-devices, such as a semiconductor device, and elements having microstructures. The article manufacturing method according to this embodiment includes a step of forming a latent image pattern in a photoresist applied on a substrate (i.e., a step of exposing a substrate) by using the above-described exposure apparatus, and a step of developing the substrate on which the latent image pattern has been formed in the above step. The article manufacturing method further includes other known steps (such as oxidation, film formation, vapor deposition, doping, planarization, etching, resist removal, dicing, bonding, and packaging). The article manufacturing method according to this embodiment is more advantageous than the related-art method in at least one among performance, quality, productivity, and production costs of the articles.

According to the present invention, the illumination optical system and the exposure apparatus each capable of realizing an improvement in the resolution performance of exposure light are obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus comprising:
an illumination optical system including a first optical modulation unit having a plurality of optical modulation elements, a second optical modulation unit having a plurality of optical modulation elements, a first imaging optical system forming a first optical images on a predetermined plane by using lights from the first optical modulation unit, and a second imaging optical system forming a second optical image on the predetermined plane by using lights from the second optical modulation unit; and
a projection optical system projecting the first optical image and the second optical image formed on the predetermined plane onto a substrate,
wherein the illumination optical system further includes a first optical-axis decentering unit shifting an optical axis of a light flux from the first optical modulation unit and a second optical-axis decentering unit shifting an optical axis of a light flux from the second optical modulation unit, wherein the first optical-axis decentering unit includes a first reflecting mirror and a second reflecting mirror, the light flux from the first optical modulation unit being shifted by reflecting it by each of the first reflecting mirror and the second reflecting mirror, and wherein the second optical-axis decentering unit includes a third reflecting mirror and a fourth reflecting mirror, the light flux from the second optical modulation unit being shifted by reflecting it by each of the third reflecting mirror and the fourth reflecting mirror.

2. The exposure apparatus according to claim 1, further comprising a polarizing beam splitter separating a light flux depending on polarization, wherein a first light flux having been reflected by the polarizing beam splitter is guided to the first optical modulation unit, and a second light flux having passed through the polarizing beam splitter is guided to the second optical modulation unit.

3. The exposure apparatus according to claim 2, wherein a $\lambda/4$ phase plate is arranged between the polarizing beam splitter and the first optical modulation unit.

4. The exposure apparatus according to claim 2, wherein a $\lambda/4$ phase plate is arranged between the polarizing beam splitter and the second optical modulation unit.

5. The exposure apparatus according to claim 2, wherein a first reflecting mirror causing the first light flux from the polarizing beam splitter to be obliquely incident on the first optical modulation unit is arranged between the polarizing beam splitter and the first optical modulation unit, and wherein a second reflecting mirror causing the second light flux from the polarizing beam splitter to be obliquely incident on the second optical modulation unit is arranged between the polarizing beam splitter and the second optical modulation unit.

6. The exposure apparatus according to claim 1, wherein the first optical modulation unit and the second optical modulation unit are each a micromirror device formed by a two-dimensional array of a plurality of micromirrors each having a reflective surface reflecting the light flux, an angle of the reflective surface being changeable.

7. The exposure apparatus according to claim 1, wherein the first optical modulation unit and the second optical modulation unit are each an acoustic-optical beam modulator.

8. The exposure apparatus according to claim 1, wherein the optical images formed by the first optical modulation unit and the second optical modulation unit are formed within a field of view of the projection optical system.

9. The exposure apparatus according to claim 8, wherein a center of the optical image formed by the first optical modulation unit and a center of the optical image formed by the second optical modulation unit are offset from each other.

10. The exposure apparatus according to claim 1, wherein the exposure apparatus performs scanning exposure on the substrate while the substrate is moved.

11. The exposure apparatus according to claim 10, wherein a center of the optical image formed by the first optical modulation unit and a center of the optical image formed by the second optical modulation unit are offset from each other in a scanning direction of the substrate.

12. The exposure apparatus according to claim 10, wherein a center of the optical image formed by the first optical modulation unit and a center of the optical image formed by the second optical modulation unit are offset from each other in a direction perpendicular to a scanning direction of the substrate.

13. The exposure apparatus according to claim 10, wherein a region doubly exposed with the light flux from the first optical modulation unit and the light flux from the second optical modulation unit is included on the substrate during one scanning exposure.

14. The exposure apparatus according to claim 1, wherein an array direction of the plurality of optical modulation elements forming the first optical modulation unit and a scanning direction of the substrate are different from each other.

15. The exposure apparatus according to claim 1, wherein an array direction of the plurality of optical modulation elements forming the second optical modulation unit and a scanning direction of the substrate are different from each other.

16. The exposure apparatus according to claim 1, wherein an optical axis of the illumination optical system and a scanning direction of the substrate are different from each other.

17. An article manufacturing method comprising steps of:
exposing a substrate by using the exposure apparatus according to claim 1; and
developing the substrate that has been exposed in the exposing step.

18. The exposure apparatus according to claim 1,
wherein the projection optical system includes an optical system condensing a light flux from the predetermined plane, and
wherein the optical system condenses the light fluxes from the first optical modulation unit and the second optical modulation unit.

19. The exposure apparatus according to claim 1,
wherein the first optical-axis decentering unit shifts the light flux by a distance between the first reflecting mirror and the second reflecting mirror, and
wherein the second optical-axis decentering unit shifts the light flux by a distance between the third reflecting mirror and the fourth reflecting mirror.

* * * * *